United States Patent [19]

Zoetman et al.

[11] Patent Number: 4,686,482

[45] Date of Patent: Aug. 11, 1987

[54] CLOCK SIGNAL ARRANGEMENT FOR REGENERATING A CLOCK SIGNAL

[75] Inventors: Herman Zoetman; Robert J. M. Verbeek, both of Hilversum, Netherlands

[73] Assignee: U.S. Philips Corporation, New York, N.Y.

[21] Appl. No.: 785,308

[22] Filed: Oct. 7, 1985

[30] Foreign Application Priority Data

Aug. 13, 1985 [NL] Netherlands .......................... 8502234

[51] Int. Cl.⁴ .......................... H03K 5/00; H03K 1/17; H03K 7/00
[52] U.S. Cl. ..................................... 328/164; 328/63; 328/72; 307/269
[58] Field of Search ............... 328/164, 162, 165, 155, 328/133, 63, 72, 109, 112; 307/269, 480

Primary Examiner—Stanley D. Miller
Assistant Examiner—Timothy P. Callahan
Attorney, Agent, or Firm—Thomas A. Briody; William J. Streeter; Gregory P. Gadson

[57] ABSTRACT

A clock signal arrangement comprises two phase-controlled loop (PLL) circuits each producing a regenerated clock signal c and r, respectively and a high-frequency oscillator signal, two time window signal generators each connected to one of the PLL circuits and also a logic circuit connected to the time window signal generators. The clock signal arrangement has for its object the regeneration of a clock signal which has a very high degree of accuracy as regards its frequency and phase. To that end, time window signals whose mutual position is a measure of the phase difference between the regenerated clock signals and whose width depends on the period duration of the oscillator signals are generated in each of the time window signal generators. In the logic circuit the time window signals clock one of the clock signals, which is only conveyed to an output terminal of the clock signal arrangement if the phase difference is less than half the duration of the period.

5 Claims, 3 Drawing Figures

CLOCK SIGNAL ARRANGEMENT FOR REGENERATING A CLOCK SIGNAL

BACKGROUND OF THE INVENTION

The invention realtes to a clock signal arrangement comprising a first clock signal regenerator connected to an input terminal and including a first phase control loop, the phase control loop comprising a first voltage-controlled oscillator for producing a first oscillator signal and first divider connected thereto for supplying a first regenerated clock signal.

Such a clock signal regenerator is described in an article entitled "Phasenregelkreis (PLL)" published in Funkschau no. 6, pages 61–68, 1983. FIG. 2 of the article shows a phase control loop in which a signal from a voltage-controlled oscillator is applied to a phase detector via a divider and a phase difference is determined, using an input signal. In the phase detector a phase difference signal is determined which via a control voltage circuit is applied to an oscillator with the aid of which the voltagecontrolled oscillator is detuned such that the phase difference is reduced.

Such a clock signal regenerator does not, however, ensure that a reliable output clock signal having an adequate phase accuracy is generated; this holds more specifically for the case in which, for example, no control voltage is applied to the voltagecontrolled oscillator because of a defect; the oscillator is then namely in the "free running" state.

SUMMARY OF THE INVENTION

The invention has for its object to provide a clock signal arrangement for generating, with an accurate phase, a reliable, fail-safe and jitter-poor clock signal.

To that end, according to the invention, the clock signal arrangement defined in the opening paragraph is characterized in that the clock signal arrangement comprises, connected to the input terminal, a second clock signal regenerator having a second phase control loop, the second phase control loop comprising a second voltage-controlled oscillator for producing a second oscillator signal and a second divider connected thereto for supplying a second regenerated clock signal with substantially the same frequency as the first regenerated clock signal, that the clock signal arrangement comprises, connected to the first clock signal regenerator, a time window signal generator for generating a first time window signal having a position related to the first regenerated clock signal, and having a duration related to the duration of the period of the first oscillator signal, that the clock signal arrangement comprises, connected to the second clock signal regenerator, a second time window signal generator for generating a second time window signal having a position related to the second regenerated clock signal and having a duration related to the duration of the period of the second oscillator signal, and that the clock signal arrangement comprises a sequential supervising circuit connected to one of the clock signal regenerators as well as to the first and second time window signal generators for supplying from an output terminal a reliable output clock signal only for as long as a phase difference between the regenerated clock signals does not exceed a predetermined threshold value determined by the position and the duration of the time window signals.

A preferred embodiment of the clock signal arrangement according to the invention, is characterized in that the sequential supervising circuit comprises a first shift register having two cascade-arranged stages, each stage having a signal input, a signal output and a clock signal input, that the signal input of the first stage is connected to the first clock signal regenerator, that the clock signal input of the first stage is connected to the second time window signal generator; and that the clock signal input of the second stage is connected to the first time window signal generator.

Advantageously, the supervising circuit is arranged as a sequential circuit which supervises itself, which results in a fail-safe operation as well as in a very high reliability.

A further preferred embodiment of the clock signal arrangement according to the invention, is characterized in that the first time window signal generator comprises a second shift register having three cascade-arranged stages and a first exclusive OR-circuit connected to the second and third stages, and that the second time window signal generator comprises a third shift register having two cascade-arranged stages and a second exclusive OR-circuit connected to the first and second stages, that the consecutive stages of the second and third shift register, respectively are clocked by oscillator signals produced by the respective first and second voltage-controlled oscillators, the durations of the periods of the first and second oscillator signals being substantially the same.

A further advantage is that said threshold value corresponds to half the period durations of the first and second oscillator signals, which offers the possibility to adjust the phase accuracy of the output clock signal to any desired value by an appropriate choice of these period durations.

The invention will now be described in greater detail by way of example with reference to the accompanying Figures in which corresponding elements are given the same reference numerals. Therein:

DETAILED DESCRIPTION OF THE INVENTION

Figure 1:
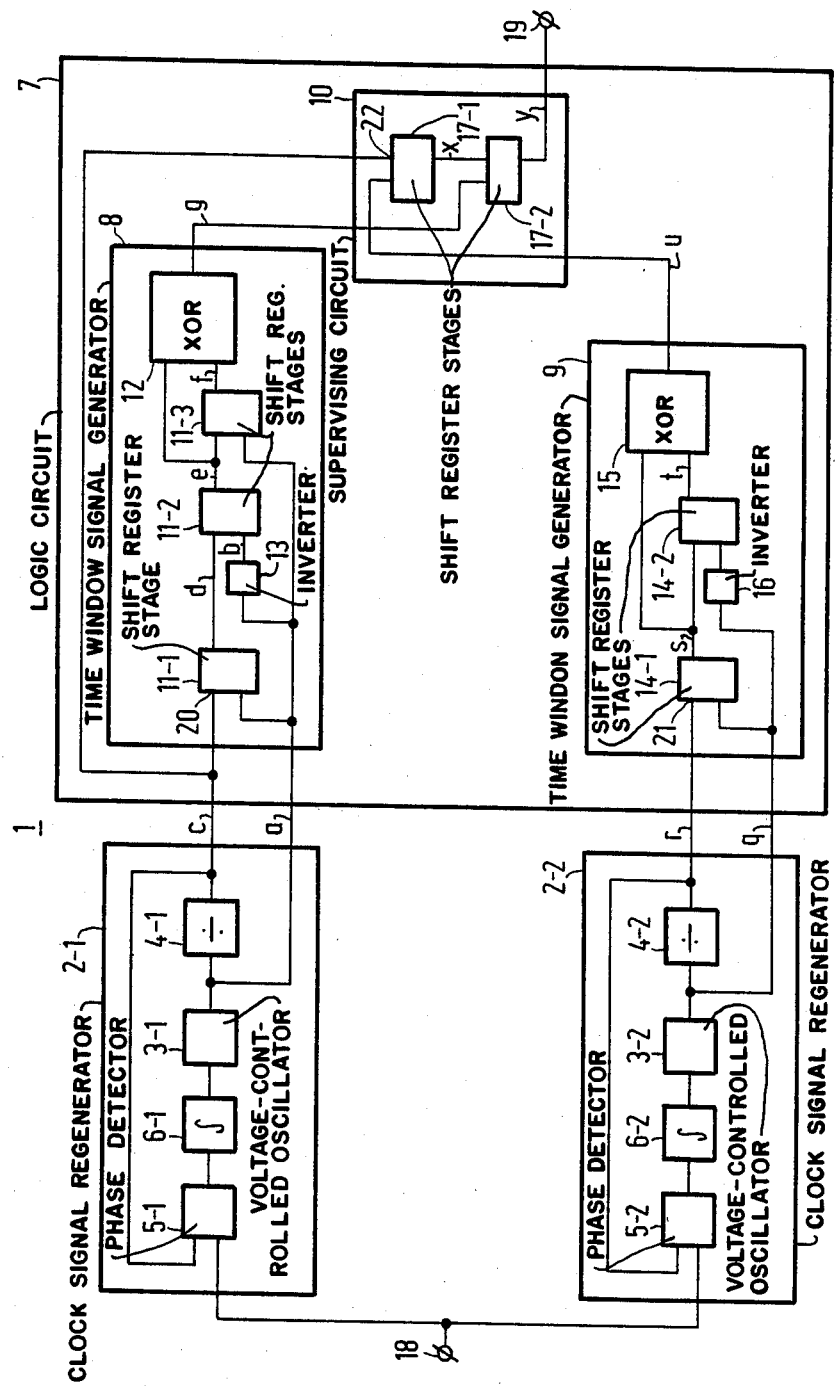
FIG. 1 shows an embodiment of the clock signal arrangement according to the invention.

In FIG. 1 a clock signal arrangement 1 is shown which is suitable for use in digital information-processing systems, for example in a digital telephone exchange. Amongst other things, regenerating the clock signals is effected in such systems. On regeneration, pulses of these clock signals which generally are distorted because of a signal transmission, are given again their correct shape, amplitude and phase (timing).

Regeneration is, for example, effected by means of a clock signal regenerator 2-1, which comprises a generally known phase control loop (PLL).

The clock signal regenerator 2-1 comprises a first voltage-controlled oscillator 3-1 for generating a first oscillator signal having a frequency of, for example, 8.192 MHz, and a first divider 4-1 with a dividend of, for example, 2048 for generating a first regenerated clock signal having a frequency of 4 kHz. The quotient of the frequency of the first oscillator signal and the dividend is chosen such that this quotient is equal to the frequency of the first regenerated clock signal, this lastmentioned frequency corresponding to the frequency of a clock signal to be applied to an input terminal 18 and to be regenerated.

In addition, the clock signal regenerator 2-1 includes a phase detector 5-1 to which the input clock signal and the first regenerated clock signal are applied, and a first integrator 6-1 which generates a control voltage for frequency-detuning of the voltage-controlled oscillator 3-1 in dependence on a phase difference, detected by the phase detector 5-1, between the input clock signal and the first regenerated clock signal.

If the relevant phase control loop becomes defective, as a result of which, for example, the phase difference between the input clock signal and the relevant regenerated clock signal is not correctly readjusted, the phase of the regenerated clock signal will start drifting, which is impermissible.

To counteract this, a second clock signal generator 2-2 is arranged in parallel with the first clock signal generator, said input clock signal being applied to the second generator. The second clock signal regenerator 2-2 is preferably identical to the first regenerator. The clock signal regenerator 2-2 comprises a phase detector 5-2, an integrator 6-2, a voltage-controlled oscillator 3-2 and a divider 4-2, which are arranged in a manner similar to the manner already described with reference to the clock signal regenerator 2-1.

In this embodiment, the second voltage-controlled oscillator 3-2 generates a second oscillator signal which has the same frequency and substantially the same phase as the first oscillator signal and the second divider 4-2 supplies a second regenerated clock signal having the same frequency and substantially the same phase as the first regenerated clock signal.

In addition, both regenerated clock signals and both oscillator signals are applied to a logic circuit 7, which is in the form of a dynamic sequential circuit. The logic circuit 7 comprises a first time window signal generator 8, a second time window signal generator 9 and a supervising circuit 10. The first time window signal generator 8 comprises a three-stage shift register 11-1 to 11-3, an inverter 13 and a read circuit in the form of an exclusive OR-circuit 12.

Figure 2:
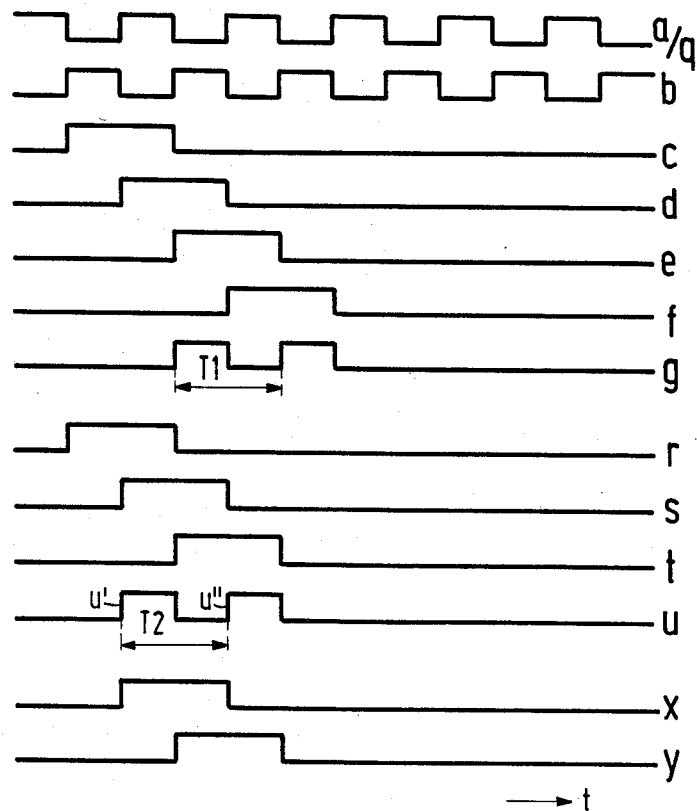
FIG. 2 shows a time sequential-diagram of signals occurring in the clock signal arrangement of FIG. 1.
Figure 3:
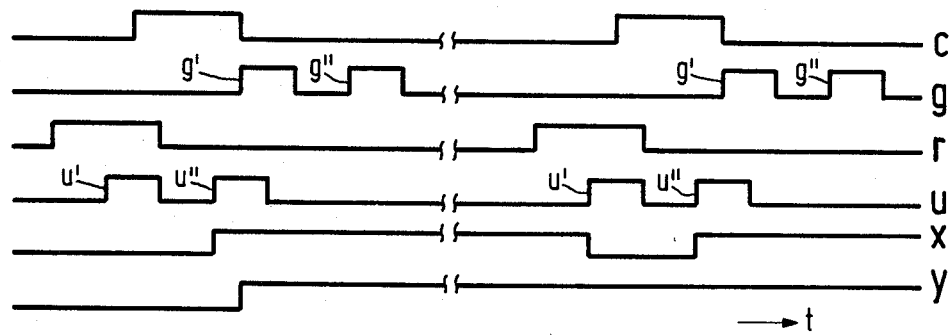
FIG. 3 is a time-sequential diagram of a selection of signals from FIG. 2.

The FIGS. 1, 2 and 3 have letters which represent signals such as they may occur in the clock signal arrangement 1 of FIG. 1.

The first regenerated clock signal c is applied to the signal input 20 of the first stage 11-1. The consecutive three stages 11-1 to 11-3 are alternately clocked directly or via the inverter 13 by means of the first oscillator signal a. The first regenerated clock signal c is thus processed such as to form the signals d, e and f, which are mutually shifted sequentially through half a period of the first oscillator signal as is shown in FIG. 2.

The signals e and f occurring at the second stage 11-2 and at the third stage 11-3 are applied to the exclusive-OR circuit 12, which produces the time window signal g. The second time window signal generator 9 comprises a two-stage shift register 14-1, 14-2, an inverter 16 and a read circuit in the form of an exclusive OR-circuit 15. The second regenerated clock signal r is applied to the signal input 21 of the first stage 14-1. The consecutive two stages 14-1, 14-2 are clocked directly and via the inverter 16 by means of a second oscillator signal q. The second regenerated clock signal r is thus processed such as to form the signals s and t, which are sequentially shifted through half a period of the second oscillator signal q. The signals s and t are processed in a similar way as the signals e and f, in the time window signal generator 9 and the exclusive OR-circuit 15 to form the second time window signal u.

When the clock signal regenerators 2-1, 2-2 operate correctly, the regenerated clock signals c, r have equal phases and a situation occurs as shown in FIG. 2. In this situation the oscillator signals a, q have the same durations and equal phases. The first regenerated clock signal c is shifted through three stages 11-1 to 11-3 and the second regenerated clock signal is shifted through two stages 14-1, 14-2.

Because said stages are clocked by oscillator signals having the same duration, the mutual phase difference between the time window signals and u amount to half this duration.

The first time window signal g has a width T, which corresponds to the period of the first oscillator signal a, the second time window signal u has also a width $T_2$, which corresponds to the period of the second oscillator signal q. The situation shown in FIG. 2 holds for the same period duration of the oscillator signals a, q, so that $T_1 = T_2$. The supervising circuit 10 includes a two-stage shift register 17-1, 17-2. For the purpose of sequential processing, the first regenerated clock signal c, originating from the first clock signal regenerator 2-1, is applied to the signal input 22 of the first stage 17-1. The first regenerated clock signal c is clocked by the second time window signal u, which is derived from the second clock signal regenerator 2-2. In the situation shown in FIG. 2 this results in a signal x. If, for example, due to malfunctioning the phase of the signals c and a produced by the first clock signal regenerator 2-1 shifts relative to the signals r and q produced by the second clock signal regenerator 2-2, the following three different situations can be obtained.

In the first situation the pulse of the first regenerated clock signal c is located completely, considered in the time, before the first ascending edge u' of the second time window signal u.

In the second situation the pulse of the first recovered clock signal c is located completely, considered in the time, after the second ascending edge u' of the second time window signal u.

In both situations the phase difference between the signals c and a on the one hand and the signal r and q on the other hand is so great, that the first regenerated clock signal c is not switched through by the first stage 17-1 of the supervising circuit 10, as a result of which signal x then retains the logic value "0". Considered for a phase difference between the first regenerated clock signal c and the second regenerated clock signal r, the first situation is obtained when the clock signal c leads the clock signal r by more than half a period $T_1$ of the first oscillator signal a, whereas the second situation occurs when the clock signal c lags the clock signal r by more than one and a half period $T_2$ of the second oscillator signal q.

In the situation shown in FIG. 2 the signal x is applied to the signal input of the second stage 17-2. This second stage 17-2 is clocked by the first time window signal g, causing the output signal y to become available at an output terminal 19.

If one of the two above-described situations arises, the signal x having the logic value "0", then the second stage 17-2 causes the output signal y to have also the logic value "0". In these two cases the first regenerated clock signal c is not made available at the output terminal 19.

As regards the phase difference between the signals c and a of the first clock signal regenerator 2-1 on the one hand and the signals r and q of the second clock signal regenerator 2-2 on the other hand, a third situation is, however, additionally possible. This third situation, of which an example is shown in FIG. 3, occurs if the first regenerated clock signal c lags the second regenerated clock signal r by more than half a period $T_2$ but less than one and a half period $T_2$ of the second oscillator signal q.

In this embodiment, the value of the signal c is assigned to the signal x in the supervising circuit 10 at the ascending edges u' and u" of the second time window signal u. Thereafter, after the signal x has been clocked at the edges g', g" of the first time window signal g, the output signal y is given the logic value "1". The situation which occurs after the two dividers 4-1, 4-2 have in this embodiment, counted 2048 periods of the different oscillator signals a, q is illustrated to the right of the broken lines in FIG. 3. On both edges u', u" of the second time window signal u the signal x takes over the value of the first regenerated signal c. The signal x is now in the inverted state compared to the situation shown in FIG. 2. After the signal x has been clocked at the edges g', g", the output signal y retains the logic value "1". Consequently, in this third case, at said phase difference, the first regenerated clock signal c is also not conveyed to the output terminal 19.

Summarizing the above-described situations, the clock signal arrangement 1 is arranged for conveying the first regenerated clock signal c to the output terminal 19 only then when the phase difference between the regenerated clock signals c and r is less than a threshold value equal to half the period of the two oscillator signals, a, q. Thus, the output terminal 19 having been provided, a regenerated, highly reliable, fail-safe and jitter-poor output signal y is then available, which can, for example, be used as a clock signal in digital information-processing systems. Advantageously, this threshold value can be chosen in a simple way, namely by choosing the frequency of the oscillator signals a, q in combination with a choice of the dividend of the dividers 4-1, 4-2. More specifically, reducing the threshold value increases the accuracy with which the phase of the output signal y is supervised.

A further advantage is that because of the sequential processing of the signals in the clock signal arrangement, an unreliable clock signal resulting from a failure in the system is prevented from becoming available as an output signal at the output terminal 19. For example, if due to a breakdown, the first time window signal g continuously keeps the logic values "0" or "1", no clock signal will be available at the output terminal 19. The same situation occurs if, for example, the signal t continuously keeps the logic values "0" or "1".

The clock signal arrangement 1 is arranged for crosswise and sequentially supervising the first regenerated clock signal c by the two time window signals g, u. Acting thus, the clock signal arrangement 1 supervises itself, which results in a failsafe operation and in that external testing becomes superfluous.

A further advantage is that the clock signal arrangement 1 according to the invention can predominantly be realized using digital circuits which can be implemented in one integrated circuit. The description is based on shift registers incorporated in the logic circuit 7, which comprise stages 11-1 to 11-3, 14-1, 14-2, 17-1, 17-2, and which respond to ascending edges of signals applied to their respective clock inputs. It will be obvious that alternatively, shift registers may be used which respond to descending edges irrespective of the fact whether what is commonly referred to as positive or negative logic is used.

More specifically, what are commonly referred to as "edge-triggered" D-flipflops can be used in these shift registers.

It will be obvious that alternatively, clock signals having frequencies other than those opted for in this description can be used, in combination with or not in combination with other frequencies of the oscillator signals a, q of the oscillators 3-1, 3-2 or other dividends of the dividers 4-1, 4-2.

What is claimed is:

1. A clock signal reproduction circuit for reproducing an input clock signal comprising:

first and second clock signal regenerators, each having a phase control loop, coupled in parallel to an input terminal for receiving said input clock signal, said first and second clock signal regenerators each having a first output for outputting a regenerated clock signal and a second output for outputting a frequency-divided regenerated clock signal which is formed by frequency dividing said regenerated clock signal by a predetermined frequency dividing factor, which predetermined frequency dividing factor is the same for both clock signal regenerators;

first and second time window signal generators coupled at their inputs to the outputs of said first and second clock signal regenerators respectively, said first time window signal generator having a time window signal generator output for outputting a time window signal whose period is directly proportional to the duration of the frequency-divided regenerated clock signal of said first clock signal regenerator and whose phase angle relative to the phase of the frequency-divided regenerated clock signal of said first clock signal regenerator is substantially maintained at a constant value, and said second time window signal generator having a time window signal generator output for outputting a time window signal whose period is directly proportional to the duration of the frequency-divided regenerated clock signal of said second clock signal regenerator and whose phase angle relative to the phase of the frequency-divided regenerated clock signal of said second clock signal regenerator is substantially maintained at a constant value; and a supervising circuit having a first input coupled to the second output of said first clock signal regenerator, a second input coupled to the time window signal generator output of said first time window signal generator, a third input coupled to the time window signal generator output of said second time window signal generator, and a supervising circuit output which serves as the output for said clock signal reproduction circuit, said supervising circuit outputting a reproduced clock signal only when the time difference between said time window signals resulting from a phase difference between the phase angles of said time window signals is less than a predefined threshold value, where said threshold value is a portion of the duration of the frequency-divided regenerated clock signal from the second output of said first clock signal regenerator.

2. The clock signal reproduction circuit as in claim 1 wherein each of said clock regenerators include a voltage-controlled oscillator for producing said regenerated clock signals coupled to said first output of its respective clock signal regenerator.

3. A clock signal reproduction circuit as claimed in claim 1, wherein the supervising circuit comprises a supervising circuit shift register having first and second cascade-arranged stages, each stage having a signal input, a signal output and a clock signal input, wherein the signal input of said first stage is coupled to said first input for receiving said frequency-divided regenerated clock signal, the clock signal input of said first stage is coupled to said third input for receiving the time window signal from said second time window signal generator, the clock signal input of said second stage is coupled to said second input for receiving the time window signal from said first time window signal generator, the signal input of said second stage is coupled to the signal output of said first stage, and the signal output of said second stage is coupled to said supervising circuit output.

4. A clock signal reproduction circuit as claimed in claim 2 or 3, wherein the first time window signal generator comprises a first shift register having three cascade-arranged stages and a first exclusive-OR circuit coupled to the second and third stages, and the second time window signal generator comprises a second shift register having two cascade-arranged stages and a second exclusive-OR circuit coupled to the first and second stages, the consecutive stages of the first and second shift register, respectively are closed by regenerated clock signals produced by the respective voltage-controlled oscillators of said first and second clock signal regenerators, the periods of the regenerated clock signals being substantially the same.

5. A clock signal arrangement as claimed in claim 3, characterized in that the first time window signal generator comprises a second shift register having three cascade-arranged stages and a first exclusvie -OR circuit connected to the second and third stages, and the second time window signal generator comprises a third shift register having two cascade-arranged stages and a second exclusive -OR circuit connected to the first and second stages, that the consecutive stages of the second and third shift registers, respectively, are clocked by the oscillator signals produced by the respective first and second voltage-controlled oscillators, the duration of the periods of the first and second oscillator signals being substantially the same.

* * * * *